(12) United States Patent
Issaq (10) Patent No.: US 7,929,345 B2
(45) Date of Patent: Apr. 19, 2011

(54) PUSH-PULL MEMORY CELL CONFIGURED FOR SIMULTANEOUS PROGRAMMING OF N-CHANNEL AND P-CHANNEL NON-VOLATILE TRANSISTORS

(75) Inventor: A. Farid Issaq, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 106 days.

(21) Appl. No.: 12/343,308

(22) Filed: Dec. 23, 2008

(65) Prior Publication Data

US 2010/0157688 A1    Jun. 24, 2010

(51) Int. Cl.
*G11C 16/04*    (2006.01)

(52) U.S. Cl. ............... 365/185.05; 365/185.29; 438/264; 257/E21.409

(58) Field of Classification Search .................. None
See application file for complete search history.

(56) References Cited

U.S. PATENT DOCUMENTS

| | | |
|---|---|---|
| 4,758,745 A | 7/1988 | Elgamal et al. |
| 4,873,459 A | 10/1989 | El Gamal et al. |
| 4,904,338 A | 2/1990 | Kozicki |
| 5,229,963 A | 7/1993 | Ohtsuka et al. |
| 5,314,772 A | 5/1994 | Kozicki et al. |
| 5,463,583 A | 10/1995 | Takashina |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |
| 5,729,162 A | 3/1998 | Rouy |
| 5,761,115 A | 6/1998 | Kozicki et al. |
| 5,812,452 A | 9/1998 | Hoang |
| 5,896,312 A | 4/1999 | Kozicki et al. |
| 5,914,893 A | 6/1999 | Kozicki et al. |
| 6,084,796 A | 7/2000 | Kozicki et al. |
| 6,100,560 A | 8/2000 | Lovett |

(Continued)

OTHER PUBLICATIONS

Co-pending U.S. Appl. No. 11/851,324, filed Sep. 6, 2007 entitled Programmable Memory Cell and Array for Programmable Logic Including Trench Isolation.

(Continued)

*Primary Examiner* — Hoai V Ho
*Assistant Examiner* — James G Norman
(74) *Attorney, Agent, or Firm* — Lewis and Roca LLP (57) ABSTRACT

A method of for programming a push-pull memory cell to simultaneously program a p-channel non-volatile transistor and an n-channel non-volatile transistor includes driving to 0v wordlines for any row in which programming of memory cells is to be inhibited; driving to a positive voltage wordlines any row in which programming of memory cells is to be performed; driving to a positive voltage the bitlines for any column in which programming of memory cells is to be inhibited; driving to a negative voltage the bitlines for any column in which programming of memory cells is to be performed; driving to one of 0v and a negative voltage a center wordline for any row in which programming of memory cells is to be inhibited; and driving to one of 0v and a positive voltage the center wordline for any row in which programming of memory cells is to be performed.

12 Claims, 4 Drawing Sheets

U.S. PATENT DOCUMENTS

| | | | |
|---|---|---|---|
| 6,137,725 | A | 10/2000 | Caser et al. |
| 6,144,580 | A | 11/2000 | Murray |
| 6,222,774 | B1 | 4/2001 | Tanzawa et al. |
| 6,324,102 | B1 | 11/2001 | McCollum |
| 6,348,365 | B1 | 2/2002 | Moore et al. |
| 6,356,478 | B1 | 3/2002 | McCollum |
| 6,388,324 | B2 | 5/2002 | Kozicki |
| 6,418,049 | B1 | 7/2002 | Kozicki et al. |
| 6,437,365 | B1 | 8/2002 | Hawley et al. |
| 6,469,364 | B1 | 10/2002 | Kozicki |
| 6,487,106 | B1 | 11/2002 | Kozicki |
| 6,635,914 | B2 | 10/2003 | Kozicki et al. |
| 6,709,887 | B2 | 3/2004 | Moore et al. |
| 6,798,692 | B2 | 9/2004 | Kozicki et al. |
| 6,825,489 | B2 | 11/2004 | Kozicki |
| 6,864,500 | B2 | 3/2005 | Gilton |
| 6,865,117 | B2 | 3/2005 | Kozicki |
| 6,891,769 | B2 | 5/2005 | McCollum et al. |
| 6,914,802 | B2 | 7/2005 | Kozicki |
| 6,927,411 | B2 | 8/2005 | Kozicki |
| 6,940,745 | B2 | 9/2005 | Kozicki |
| 6,955,940 | B2 | 10/2005 | Campbell et al. |
| 6,970,383 | B1 | 11/2005 | Han et al. |
| 6,985,378 | B2 | 1/2006 | Kozicki |
| 6,998,312 | B2 | 2/2006 | Kozicki et al. |
| 7,006,376 | B2 | 2/2006 | Kozicki |
| 7,101,728 | B2 | 9/2006 | Kozicki et al. |
| 7,120,053 | B2 | 10/2006 | Atsumi et al. |
| 7,120,079 | B2 | 10/2006 | McCollum et al. |
| 7,142,450 | B2 | 11/2006 | Kozicki et al. |
| 7,145,794 | B2 | 12/2006 | Kozicki |
| 7,169,635 | B2 | 1/2007 | Kozicki |
| 7,180,104 | B2 | 2/2007 | Kozicki |
| 7,187,610 | B1 | 3/2007 | McCollum et al. |
| 7,227,169 | B2 | 6/2007 | Kozicki |
| 7,245,535 | B2 | 7/2007 | McCollum et al. |
| 7,288,781 | B2 | 10/2007 | Kozicki |
| 7,294,875 | B2 | 11/2007 | Kozicki |
| 7,301,821 | B1 | 11/2007 | Greene et al. |
| 7,368,789 | B1 | 5/2008 | Dhaoui et al. |
| 7,372,065 | B2 | 5/2008 | Kozicki et al. |
| 7,385,219 | B2 | 6/2008 | Kozicki et al. |
| 7,402,847 | B2 | 7/2008 | Kozicki et al. |
| 7,405,967 | B2 | 7/2008 | Kozicki et al. |
| 7,430,137 | B2 | 9/2008 | Greene et al. |
| 7,499,360 | B2 | 3/2009 | McCollum |
| 7,511,532 | B2 | 3/2009 | Derharcobian et al. |
| 7,560,722 | B2 | 7/2009 | Kozicki |
| 7,675,766 | B2 | 3/2010 | Kozicki |
| 7,692,972 | B1 | 4/2010 | Sadd et al. |
| 7,728,322 | B2 | 6/2010 | Kozicki |
| 7,763,158 | B2 | 7/2010 | Kozicki |
| 7,839,681 | B2 | 11/2010 | Wang et al. |
| 2003/0107105 | A1 | 6/2003 | Kozicki |
| 2004/0124407 | A1 | 7/2004 | Kozicki et al. |
| 2005/0225413 | A1 | 10/2005 | Kozicki et al. |
| 2006/0086989 | A1* | 4/2006 | Lee et al. ............ 257/371 |
| 2006/0238185 | A1 | 10/2006 | Kozicki |
| 2006/0291364 | A1 | 12/2006 | Kozicki |
| 2007/0165446 | A1 | 7/2007 | Oliva et al. |
| 2007/0165532 | A1 | 7/2007 | Retana et al. |
| 2008/0101117 | A1* | 5/2008 | Ogura et al. ......... 365/185.05 |
| 2008/0211540 | A1 | 9/2008 | Fujita |
| 2008/0279028 | A1 | 11/2008 | McCollum et al. |
| 2009/0283740 | A1 | 11/2009 | Kozicki et al. |
| 2010/0092656 | A1 | 4/2010 | Kozicki |
| 2010/0135071 | A1 | 6/2010 | Kozicki |
| 2010/0149873 | A1 | 6/2010 | Wang |
| 2010/0208520 | A1 | 8/2010 | Wang |
| 2011/0001108 | A1 | 1/2011 | Greene et al. |
| 2011/0001115 | A1 | 1/2011 | Greene et al. |
| 2011/0001116 | A1 | 1/2011 | Greene et al. |
| 2011/0002167 | A1 | 1/2011 | McCollum |
| 2011/0024821 | A1 | 2/2011 | Wang et al. |

OTHER PUBLICATIONS

Co-pending U.S. Appl. No. 12/177,680, filed Jul. 22, 2008 entitled Split Gate Memory Cell for Programmable Circuit Device.

Co-pending U.S. Appl. No. 12/334,059, filed Dec. 12, 2008 entitled Push-Pull FPGA Cell.

Co-pending U.S. Appl. No. 12/371,483, filed Feb. 13, 2009 entitled Array and Control Method for Flash Based FPGA Cell.

Aratani, K. "A Novel Resistance Memory with High Scalability and Nanosecond Switching," IEDM, 2007, pp. 783-786.

Baek, I. G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, G. W. et al., "Overview of Candidate Device Technologies for Storage-class Memory," IBM Journal of Research & Development, 2008, vol. 52, No. 4/5, pp. 449-464.

Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, T. N. et al, "Erase Mechanism for Copper Oxide Resistive Switching Memory Cells with Nickel Electrode," Int'l Electron Devices Meeting, 2006, pp. 1-4.

Greene, Jonathan et al., "Antifuse Field Programmable Gate Arrays," Proceedings of the IEEE, Jul. 1993, vol. 81, No. 7, pp. 1042-1056.

Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pages.

Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, Dimitri B. et al., "The Missing Memristor Found," Nature, May 1 2008, vol. 453, pp. 80-85.

Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

U.S. Appl. No. 11/851,324 filed Sep. 6, 2007 entitled "Programmable Memory Cell and Array for Programmable Logic Including Trench Isolation," and abandoned Jun. 19, 2009.

Lemieux, G. et al., "Directional and Single-Driver Wires in FPGA Interconnect," International Conference on Field-Programmable Technology (ICFPT), Dec. 2004, pp. 41-48, Brisbane, Australia.

* cited by examiner

| | Write Condition | | | | | | | | |
|---|---|---|---|---|---|---|---|---|---|
| | Select WL | | Inhibit BL | | | Select BL | | Inhibit BL | | PW | NW | SW | |
| | | | | | | | | | | | | S | D |
| Simultaneous Pgm (Ver. 1) | 8.5 | 0 | 15.5 | 0 | 0 | -3.5 | 3.5 | 3.5 | -3.5 | 3.5 | 0 | 0 |
| Simultaneous Pgm (Ver. 2) | 8.5 | -4.5 | 15.5 | 0 | 0 | -2.5 | 2.5 | 2.5 | -2.5 | 2.5 | 0 | 0 |
| Normal Operation | 2.5 | 0 | 2 | 2 | 1 | 2.5 | 0 | 0 | 0 | 0 | 2.5 | 1.2 | 1.2 |

FIGURE 4

PUSH-PULL MEMORY CELL CONFIGURED FOR SIMULTANEOUS PROGRAMMING OF N-CHANNEL AND P-CHANNEL NON-VOLATILE TRANSISTORS

BACKGROUND OF THE INVENTION

1. Field of the Invention

The present invention relates to non-volatile memory cells and to push-pull non-volatile memory cells. More particularly, the present invention relates to simultaneous programming of the n-channel and p-channel non-volatile memory devices in a push-pull non-volatile memory cell.

2. The Prior Art

Push-pull flash memory cells are known in the art. These memory cells have been previously programmed in two steps, e.g., first programming the p-channel non-volatile transistor and then programming the n-channel non-volatile transistor.

Previous push-pull memory cells and programming methods have suffered from several drawbacks. First, the two-step programming of the p-channel non-volatile transistor and the n-channel non-volatile transistor takes additional time, especially in larger arrays. In addition, relatively higher gate-induced drain leakage and high p-channel volatile transistor gate stress of unselected cells might occur during programming.

BRIEF DESCRIPTION

According to one illustrative aspect of the present invention, a push-pull memory cell includes a p-channel non-volatile transistor having a source coupled to a source line, a drain, a floating gate and a control gate, the control gate coupled to a p-channel word line, a p-channel volatile transistor having a source coupled to the drain of the p-channel non-volatile transistor, a drain, and a control gate coupled to a programming word line, and an n-channel non-volatile transistor having a source coupled to a bit line, a drain coupled to the drain of the p-channel volatile transistor, a floating gate and a control gate, the control gate coupled to an n-channel word line.

According to another illustrative aspect of the present invention, an array of push-pull memory cells arranged in a plurality of rows and columns includes a $V_P$ line associated with each row of the array, a p-word line associated with each row of the array, an n-word line associated with each row of the array, a program-word line associated with each row of the array, and a bit line associated with each column of the array. The array includes a plurality of memory cells, each memory cell uniquely associated with a row in the array and a column in the array. Each memory cell includes a p-channel non-volatile transistor having a source coupled to the $V_P$ line associated with its row, a drain, a floating gate and a control gate, the control gate coupled to the p-word line associated with its row. A p-channel volatile transistor has a source coupled to the drain of the p-channel non-volatile transistor, a drain, and a control gate coupled to the program-word line associated with its row. An n-channel non-volatile transistor has a source coupled to the bit line associated with its column, a drain coupled to the drain of the p-channel volatile transistor, a floating gate and a control gate, the control gate coupled to an n-word line associated with its row.

According to another illustrative aspect of the present invention, an array of push-pull memory cells arranged in a plurality of rows and columns includes a p-word line associated with each row of the array, an n-word line associated with each row of the array, a program-word line associated with each row of the array, a p-bit line associated with each column of the array, and an n-bit line associated with each column of the array. The array includes a plurality of memory cells, each memory cell uniquely associated with a row in the array and a column in the array. Each memory cell includes a p-channel non-volatile transistor having a source coupled to the p-bit line associated with its column, a drain, a floating gate and a control gate, the control gate coupled to the p-word line associated with its row. A p-channel volatile transistor has a source coupled to the drain of the p-channel non-volatile transistor, a drain, and a control gate coupled to the program-word line associated with its row. An n-channel non-volatile transistor has a source coupled to the n-bit line associated with its column, a drain coupled to the drain of the p-channel volatile transistor, a floating gate and a control gate, the control gate coupled to the n-word line associated with its row.

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
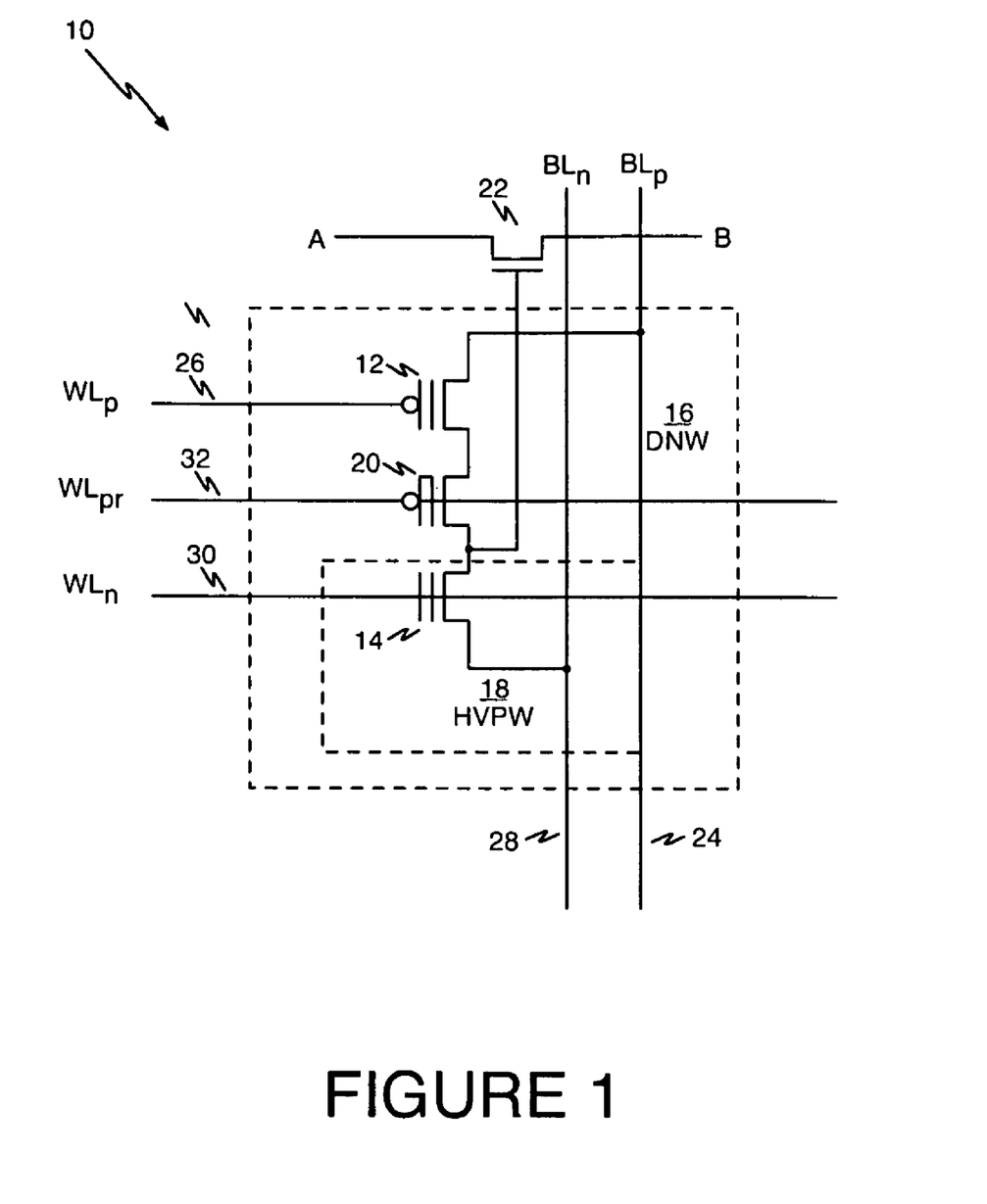
FIG. 1 is a schematic diagram of an illustrative push-pull memory cell according to one aspect of the present invention.

Referring now to FIG. 1, a schematic diagram shows an illustrative push-pull flash memory cell 10 according to one aspect of the present invention. Flash memory cell 10 includes p-channel non-volatile memory transistor 12 and n-channel non-volatile memory transistor 14. P-channel non-volatile memory transistor 12 is formed in deep n-well 16 and n-channel non-volatile memory transistor 14 is formed in high-voltage p-well 18.

Memory cell 10 also includes a third transistor, p-channel transistor 20. P-channel transistor 20 may be formed as a double gate structure like transistors 12 and 14, having its floating gate shorted to its control gate as shown by the schematic symbol in which the two gates are connected. Such a geometry lowers the on-state $V_{DS}$ of the transistor and allows p-channel transistor 20 to be formed without having to observe single-poly to double-poly design-rule spacing to allow for a smaller cell geometry. Persons skilled in the art will appreciate that P-channel transistor 20 may also be formed as a single-gate transistor.

Memory cell 10 also includes n-channel switch transistor 22, having its gate connected to the common drain connections of n-channel non-volatile transistor 14 and p-channel transistor 20. N-channel switch transistor 22 is used to selectively connect together the circuit nodes identified as A and B in FIG. 1. Since switch transistor 22 is an n-channel device, it will be turned on during normal circuit operation when p-channel volatile transistor 20 is turned on and when the memory cell 10 is programmed such that p-channel non-volatile transistor 12 is turned on and n-channel non-volatile transistor 14 is turned off.

The source of p-channel non-volatile transistor 12 is coupled to p bitline (reference numeral 24) that runs in the column direction of the array. The gate of p-channel non-volatile transistor 12 is coupled to p-channel wordline $WL_p$ (reference numeral 26) that runs in the row direction of the array. The source of n-channel non-volatile transistor 14 is coupled to bitline BL (reference numeral 28) that runs in the column direction of the array. The gate of n-channel non-volatile transistor 14 is coupled to n-channel wordline $WL_n$ (reference numeral 30) that runs in the row direction of the array. The gate of p-channel volatile transistor 20 is coupled to wordline $WL_{pr}$ (reference numeral 32) that runs in the row direction of the array.

As previously mentioned, p-channel volatile transistor 20 is turned on during normal circuit operation so that p-channel non-volatile memory transistor 12 and n-channel non-volatile memory transistor 14 are connected in series and act as a push-pull memory cell under the condition that one of them is turned on and the other one is turned off to drive the gate of n-channel switch transistor 22 to either ground through n-channel non-volatile memory transistor 14 to turn it off or to VDD through p-channel non-volatile memory transistor 12 and p-channel volatile transistor 20 (turned on during normal circuit operation) to turn it on. Thus, during normal circuit operation all of the wordlines $WL_{pr}$ in the array are driven to zero volts.

Programming of memory cell 10 is accomplished by placing the appropriate potentials on the various control lines $WL_p$, $WL_n$, and $WL_{pr}$, and p bitline 24 and n bitline 28. For example, by simultaneously applying about 12 v to about 16 v to the n-channel wordline 30 and about 6 v to about 9 v to the p-channel wordline 26 while applying about −2 v to about −4 v to the bitline line 24 and the bitline 28, both p-channel non-volatile transistor 12 and p-channel non-volatile transistor 14 can be programmed simultaneously.

Figure 2:
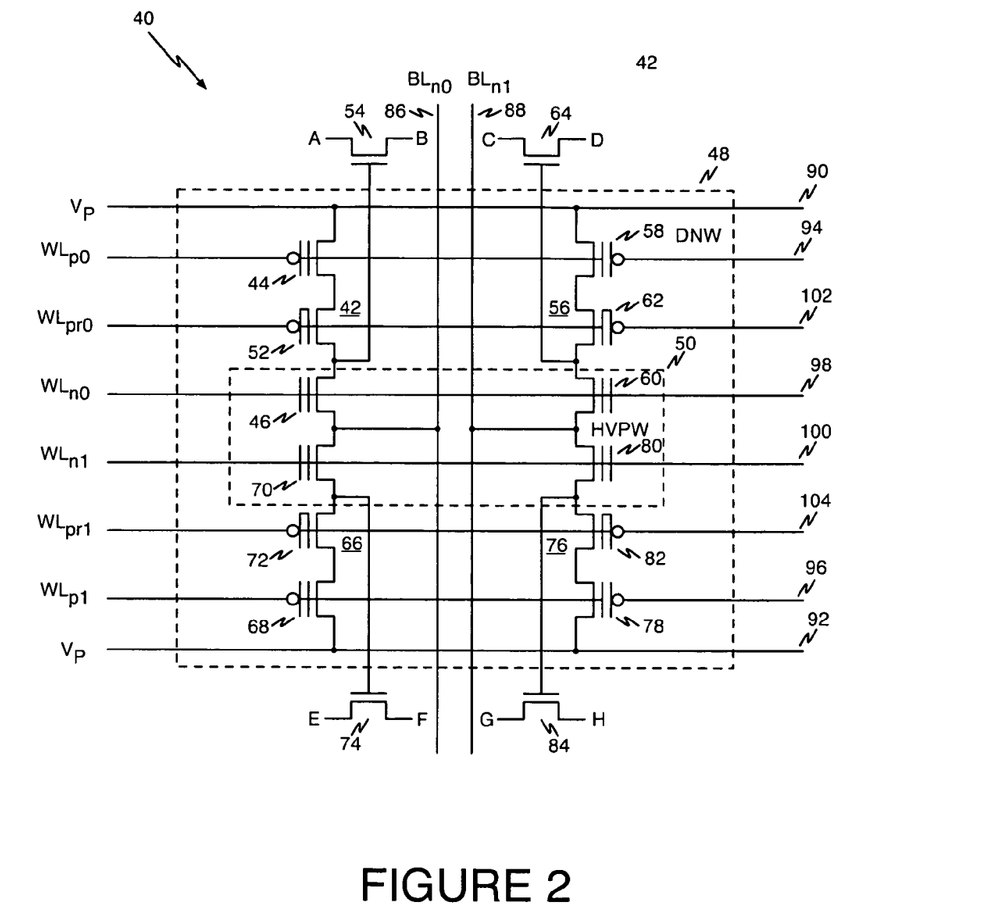
FIG. 2 is a schematic diagram of a portion of an illustrative array of push-pull memory cells according to one aspect of the present invention.

Referring now to FIG. 2, a schematic diagram shows a portion 40 of an illustrative array of push-pull non-volatile memory cells according to one aspect of the present invention. Portion 40 of the array of push-pull non-volatile memory cells is shown having four memory cells arrayed in two rows and two columns although persons of ordinary skill in the art will recognize from this disclosure that arrays of any size may be fabricated using the principles of the present invention. The memory cell 42 in the first row of the first column of array 40 includes p-channel non-volatile memory transistor 44 and n-channel non-volatile memory transistor 46. P-channel non-volatile memory transistor 44 is formed in deep n-well 48 and n-channel non-volatile memory transistor 46 is formed in high-voltage p-well 50.

Memory cell 42 also includes a third transistor, p-channel transistor 52. P-channel transistor 52 may be formed as a double gate structure like transistors 44 and 46, having its floating gate shorted to its control gate as shown by the schematic symbol in which the two gates are connected. Such a geometry lowers the on-state $V_{DS}$ of the transistor and allows p-channel transistor 52 to be formed without having to observe single-poly to double-poly design-rule spacing to allow for a smaller cell geometry. Persons skilled in the art will appreciate that P-channel transistor 52 may also be formed as a single-gate transistor.

Memory cell 42 also includes n-channel switch transistor 54, having its gate connected to the common drain connections of n-channel non-volatile transistor 46 and p-channel transistor 52. N-channel switch transistor 54 is used to selectively connect together the circuit nodes identified as A and B in FIG. 2. Since switch transistor 54 is a N-channel device, it will be turned on during normal circuit operation when p-channel volatile transistor 52 is turned on and when the memory cell 42 is programmed such that p-channel non-volatile transistor 44 is turned on and n-channel non-volatile transistor 46 is turned off.

The memory cell 56 in the first row of the second column of array 40 includes p-channel non-volatile memory transistor 58 and n-channel non-volatile memory transistor 60. P-channel non-volatile memory transistor 58 is formed in deep n-well 48 and n-channel non-volatile memory transistor 60 is formed in high-voltage p-well 50.

Memory cell 56 also includes a third transistor, p-channel transistor 62. P-channel transistor 62 may be formed as a double gate structure like transistors 58 and 60, having its floating gate shorted to its control gate as shown by the schematic symbol in which the two gates are connected. Such a geometry lowers the on-state $V_{DS}$ of the transistor and allows p-channel transistor 62 to be formed without having to observe single-poly to double-poly design-rule spacing to allow for a smaller cell geometry. Persons skilled in the art will appreciate that P-channel transistor 62 may also be formed as a single-gate transistor.

Memory cell 56 also includes n-channel switch transistor 64, having its gate connected to the common drain connections of n-channel non-volatile transistor 60 and p-channel transistor 62. N-channel switch transistor 64 is used to selectively connect together the circuit nodes identified as C and D in FIG. 2. Since switch transistor 64 is an n-channel device, it will be turned on during normal circuit operation when p-channel volatile transistor 62 is turned on and when the memory cell 56 is programmed such that p-channel non-volatile transistor 58 is turned on and n-channel non-volatile transistor 60 is turned off.

The memory cell 66 in the second row of the first column of array 40 includes p-channel non-volatile memory transistor 68 and n-channel non-volatile memory transistor 70. P-channel non-volatile memory transistor 68 is formed in deep n-well 48 and n-channel non-volatile memory transistor 70 is formed in high-voltage p-well 50.

Memory cell 66 also includes a third transistor, p-channel transistor 72. P-channel transistor 72 may be formed as a double gate structure like transistors 68 and 70, having its floating gate shorted to its control gate as shown by the schematic symbol in which the two gates are connected. Such a geometry lowers the on-state $V_{DS}$ of the transistor and allows p-channel transistor 72 to be formed without having to observe single-poly to double-poly design-rule spacing to allow for a smaller cell geometry. Persons skilled in the art will appreciate that P-channel transistor 72 may also be formed as a single-gate transistor.

Memory cell 66 also includes n-channel switch transistor 74, having its gate connected to the common drain connections of n-channel non-volatile transistor 70 and p-channel transistor 72. N-channel switch transistor 74 is used to selectively connect together the circuit nodes identified as E and F in FIG. 2. Since switch transistor 74 is an n-channel device, it will be turned on during normal circuit operation when p-channel volatile transistor 72 is turned on and when the memory cell 66 is programmed such that p-channel non-volatile transistor 68 is turned on and n-channel non-volatile transistor 70 is turned off.

The memory cell 76 in the second row of the second column of array 40 includes p-channel non-volatile memory transistor 78 and n-channel non-volatile memory transistor 80. P-channel non-volatile memory transistor 78 is formed in deep n-well 48 and n-channel non-volatile memory transistor 80 is formed in high-voltage p-well 50.

Memory cell 76 also includes a third transistor, p-channel transistor 82. P-channel transistor 82 may be formed as a double gate structure like transistors 78 and 80, having its floating gate shorted to its control gate as shown by the schematic symbol in which the two gates are connected. Such a geometry lowers the on-state $V_{DS}$ of the transistor and allows p-channel transistor 82 to be formed without having to observe single-poly to double-poly design-rule spacing to allow for a smaller cell geometry. Persons skilled in the art will appreciate that P-channel transistor 82 may also be formed as a single-gate transistor.

Memory cell 76 also includes n-channel switch transistor 84, having its gate connected to the common drain connections of n-channel non-volatile transistor 80 and p-channel transistor 82. N-channel switch transistor 84 is used to selectively connect together the circuit nodes identified as G and H in FIG. 2. Since switch transistor 84 is an n-channel device, it will be turned on during normal circuit operation when p-channel volatile transistor 82 is turned on and when the memory cell 76 is programmed such that p-channel non-volatile transistor 78 is turned on and n-channel non-volatile transistor 80 is turned off.

In the portion 40 of the memory array shown in FIG. 2, the sources of the n-channel non-volatile transistors 46 and 70 in the first column of the array are coupled to a bitline 86. The sources of the n-channel non-volatile transistors 60 and 80 in the second column of the array are coupled to a bitline 88. The sources of the p-channel non-volatile transistors 44 and 58 in the first row of the array are connected to Vp line 90, and the sources of the p-channel non-volatile transistors 68 and 78 in the second row of the array are connected to Vp line 92.

The control gates of the p-channel non-volatile transistors 44 and 58 in the first row of the array are coupled to wordline $WL_{p0}$ at reference numeral 94. The control gates of the p-channel non-volatile transistors 68 and 78 in the second row of the array are coupled to wordline $WL_{p1}$ at reference numeral 96. The control gates of the n-channel non-volatile transistors 46 and 60 in the first row of the array are coupled to wordline $WL_{n0}$ at reference numeral 98. The control gates of the n-channel non-volatile transistors 70 and 80 in the second row of the array are coupled to wordline $WL_{n1}$ at reference numeral 100. The control gates of the p-channel volatile transistors 52 and 62 in the first row of the array are coupled to wordline $WL_{pr0}$ at reference numeral 102. The control gates of the p-channel volatile transistors 72 and 82 in the second row of the array are coupled to wordline $WL_{pr1}$ at reference numeral 104.

Figure 3:
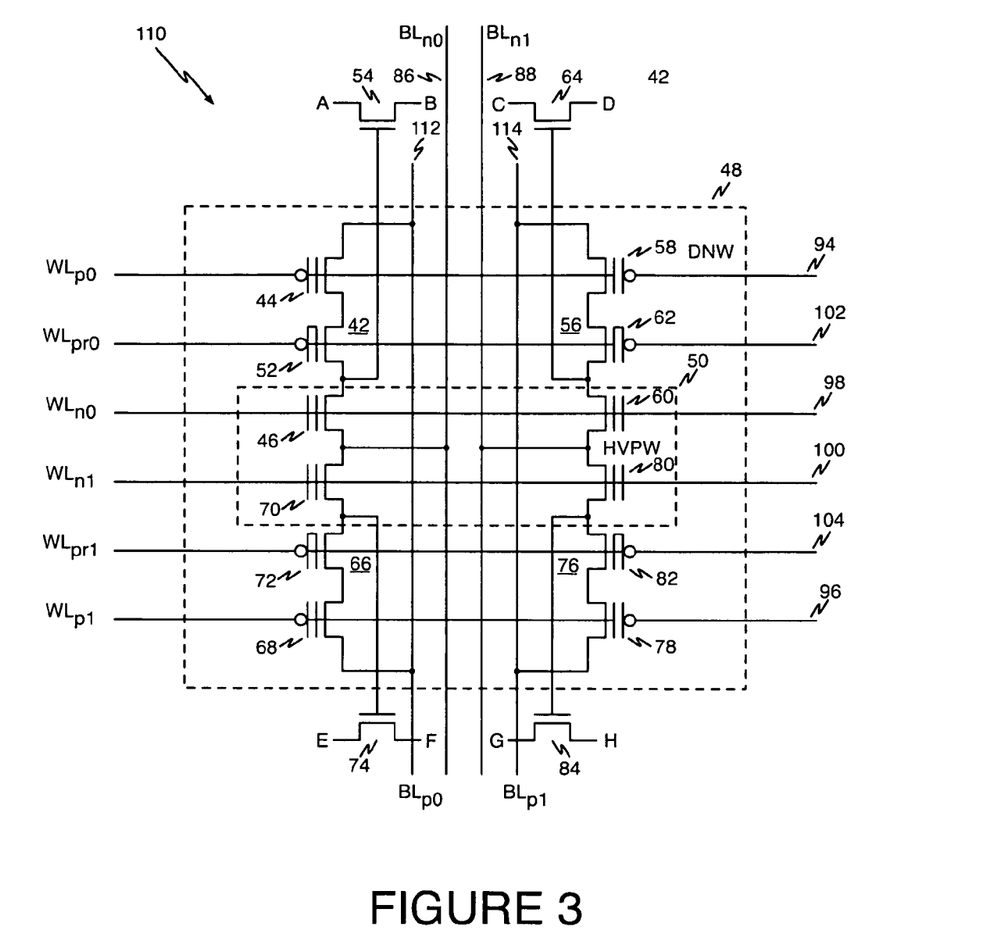
FIG. 3 is a schematic diagram of a portion of another illustrative array of push-pull memory cells according to one aspect of the present invention.

Referring now to FIG. 3, a schematic diagram shows a portion 110 of another illustrative array of push-pull memory cells according to an aspect of the present invention. The portion 110 of the array of FIG. 3 is substantially similar to the array 40 of FIG. 2 and, where appropriate structures in FIG. 3 that correspond to like structures in FIG. 2 are identified by the same reference numerals used in FIG. 2. The description accompanying FIG. 2 applies for the most part to the array shown in FIG. 3 except that there are some differences in the wiring of the cells in the portion 110 of the array of FIG. 3. Instead of $V_p$ lines running in the row direction of the array being coupled to the sources of the p-channel non-volatile transistors in the same row, bitlines $BL_{n0}$ (identified at reference numeral 112) and $BL_{n1}$ (identified at reference numeral 114) run in the column direction and are coupled to the sources of the p-channel non-volatile transistors in the same column.

Figure 4:
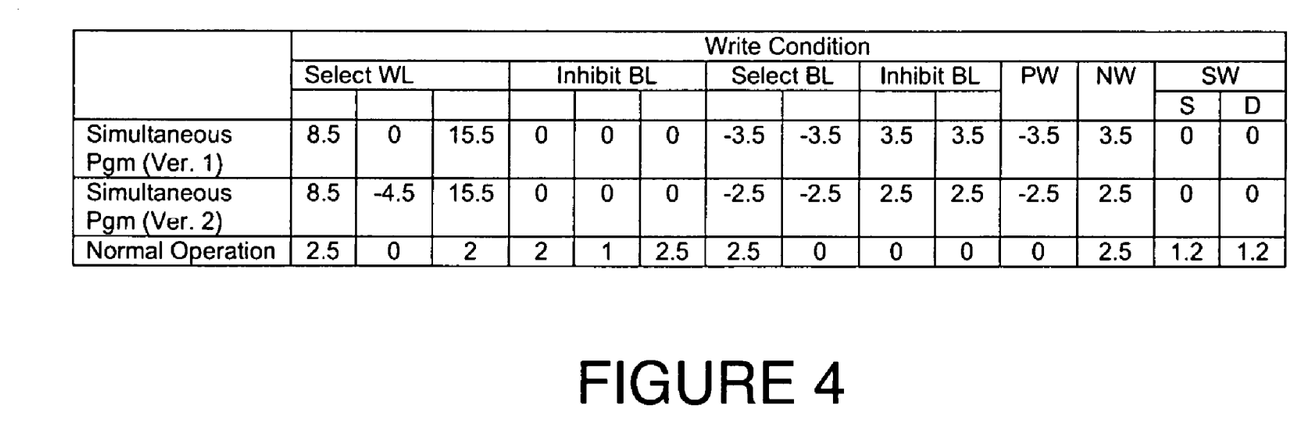
FIG. 4 is a table showing exemplary programming and operating conditions for the various operating modes of the array portions shown in FIGS. 2 and 3.

Referring now to FIG. 4, a table shows exemplary programming conditions for the various operating modes of the array portions shown in FIGS. 2 and 3. The table of FIG. 4 shows two alternate versions of biasing conditions for simultaneous programming for the array shown in FIG. 3 and one version of biasing conditions for simultaneous programming for the array shown in FIG. 2 according to the present invention. While specific voltages are shown in the table of FIG. 4, persons skilled in the art will appreciate that actual voltages used in any array will depend on device geometry and process considerations and that the numbers given in the table are merely illustrative and the values used herein relate to memory cells fabricated using a 0.65 micron process.

In general, for programming the arrays shown in both FIGS. 2 and 3, to inhibit programming in row x, wordlines $WL_{px}$, $WL_{nx}$, and $WL_{prx}$ for row x are driven to 0 v and to inhibit programming in column y, the bitlines $BL_{py}$ and $BL_{ny}$ for column y are driven to a positive voltage. To select programming in row x, wordlines $WL_{px}$ and $WL_{nx}$ for row x are driven to positive voltages, wordline $WL_{prx}$ is driven to either 0 v or a negative voltage, and to enable programming in column y, the bitlines $BL_{py}$ and $BL_{ny}$ for column y are driven to a negative voltage.

According to a first version of simultaneous programming for the array shown in FIG. 3, bitlines $BL_{n0}$ and $BL_{p0}$ are driven to a potential of −3.5 v and bitlines $BL_{n1}$ and $BL_{p1}$ are driven to a potential of 3.5 v. In the first row of the array, wordline $WL_{p0}$ is driven to a potential of 8.5 v, wordline $WL_{pr0}$ is driven to a potential of 0 v, and $WL_{n0}$ is driven to a potential of 15.5 v. In the second row of the array, wordline $WL_{p1}$ is driven to a potential of 0 v, $WL_{pr1}$ is driven to a potential of between 0 v and 2 v, and $WL_{n1}$ is driven to a potential of 0 v. The deep n-well 48 is driven to a potential of 3.5 v and the high-voltage p-well 50 is driven to a potential of −3.5 v.

In memory cell 42 the $V_{gs}$ of p-channel non-volatile transistor 44 is 12.0 v, the $V_{gs}$ of n-channel non-volatile transistor 46 is 19.0 v, and the $V_{gs}$ of p-channel volatile transistor 52 is 3.5 v. Under these conditions, transistors 44 and 52 will be turned off and transistor 46 will be turned on. In memory cell 56 the $V_{gs}$ of p-channel non-volatile transistor 58 is 5.0 v, the $V_{gs}$ of n-channel non-volatile transistor 60 is 12.0 v, and the $V_{gs}$ of p-channel volatile transistor 62 is −3.5 v. Under these conditions, transistor 58 will be turned off and transistors 60 and 62 will be turned on.

In memory cell 66 the $V_{gs}$ of p-channel non-volatile transistor 68 is 3.5 v, the $V_{gs}$ of n-channel non-volatile transistor 70 is 3.5 v, and the $V_{gs}$ of p-channel volatile transistor 72 is 5.5 v. Under these conditions, if memory cell 66 is programmed, transistor 68 will be turned on or off depending on the $V_t$ shift during the life cycle of the transistor, and transistors 70, and 72 will be turned off. If memory cell 66 is erased, transistors 68 and 72 will be turned off and transistor 70 will be turned on or off depending on the $V_t$ shift during the life cycle of the transistor. In memory cell 76 the $V_{gs}$ of p-channel non-volatile transistor 78 is −3.5 v, the $V_{gs}$ of n-channel non-volatile transistor 80 is −3.5 v, and the $V_{gs}$ of p-channel volatile transistor 82 is −1.5 v. Under these conditions, if memory cell 76 is programmed, transistors 80 and 82 will be turned off and transistor 78 will be turned on. If memory cell 66 is erased, transistors 80 and 82 will be turned off and transistor 78 may be in either state.

According to a second version of simultaneous programming for the array shown in FIG. 3, bitlines BLn0 and BLp0 are driven to a potential of −2.5 v and bitlines BLn1 and BLp1 are driven to a potential of 2.5 v. In the first row of the array, wordline WLp0 is driven to a potential of 8.5 v, wordline WLpr0 is driven to a potential of −4.5 v, and WLn0 is driven to a potential of 14.5 v. In the second row of the array, wordline WLp1 is driven to a potential of 0 v, WLpr1 is driven to a potential of 0 v, and WLn1 is driven to a potential of 0 v. The deep n-well 48 is driven to a potential of 2.5 v and the high-voltage p-well 50 is driven to a potential of −2.5 v.

According to a version of simultaneous programming for the array shown in FIG. 2, bitline $BL_{p0}$ is driven to a potential of 0 v, $BL_{n0}$ is driven to a potential of −3 v, bitline $BL_{p1}$ is driven to a potential of 0 v and $BL_{n1}$ is driven to a potential of 3 v. In the first row of the array, wordline $WL_{p0}$ is driven to a potential of 8.5 v, wordline $WL_{pr0}$ is driven to a potential of −5 v, and $WL_{n0}$ is driven to a potential of 15.5 v. In the second row of the array, wordline $WL_{p1}$ is driven to a potential of 0 v, $WL_{pr1}$ is driven to a potential of −3 v, and $WL_{n1}$ is driven to a potential of 0 v. The deep n-well 48 is driven to a potential of 3 v and the high-voltage p-well 50 is driven to a potential of −3 v.

In memory cell 42 the $V_{gs}$ of p-channel non-volatile transistor 44 is 11.5, the $V_{gs}$ of n-channel non-volatile transistor 46 is 18.5 v, and the $V_{gs}$ of p-channel volatile transistor 52 is −2.0 v. Under these conditions, transistors 44 will be turned off and transistor 52 and 46 will be turned on. In memory cell 56 the $V_{gs}$ of p-channel non-volatile transistor 58 is 8.0 v, the $V_{gs}$ of n-channel non-volatile transistor 60 is 12.5 v, and the $V_{gs}$ of p-channel volatile transistor 62 is −8.0 v. Under these conditions, transistor 58 will be turned off and transistors 60 and 62 will be turned on.

In memory cell 66 the $V_{gs}$ of p-channel non-volatile transistor 68 is 0 v, the $V_{gs}$ of n-channel non-volatile transistor 70 is 3.0 v, and the $V_{gs}$ of p-channel volatile transistor 72 is 0 v. Under these conditions, if memory cell 66 is programmed, transistor 68 will be turned on or off depending on the $V_t$ shift during the life cycle of the transistor, and transistors 70 off and 72 will be turned on. If memory cell 66 is erased, transistors 68 and 72 will be turned off and transistor 70 will be turned on. In memory cell 76 the $V_{gs}$ of p-channel non-volatile transistor 78 is 0 v, the $V_{gs}$ of n-channel non-volatile transistor 80 is −3.0 v, and the $V_{gs}$ of p-channel volatile transistor 82 is −3.0 v. Under these conditions, if memory cell 76 is programmed, transistors 80 will be turned off and transistor 82 turned on and transistor 78 will be turned on or off. If memory cell 66 is erased, transistors 80 and 78 will be turned off and transistor 82 turned on.

According to a second version of simultaneous programming for the array shown in FIG. 3, bitlines BLn0 and BLp0 are driven to a potential of −2.5 v and bitlines BLn1 and BLp1 are driven to a potential of 2.5 v. In the first row of the array, wordline WLp0 is driven to a potential of 8.5 v, wordline WLpr0 is driven to a potential of −4.5 v, and WLn0 is driven to a potential of 14.5 v. In the second row of the array, wordline WLp1 is driven to a potential of 0 v, WLpr1 is driven to a potential of 0 v, and WLn1 is driven to a potential of 0 v. The deep n-well 48 is driven to a potential of 2.5 v and the high-voltage p-well 50 is driven to a potential of −2.5 v.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an array of push-pull memory cells arranged in a plurality of rows and columns, the array comprising a $V_p$ line associated with each row of the array, a p-wordline associated with each row of the array, an n-wordline associated with each row of the array, a program wordline associated with each row of the array, a bit line associated with each column of the array, and a plurality of memory cells, each memory cell uniquely associated with a row in the array and a column in the array, each memory cell including a p-channel non-volatile transistor having a source coupled to the Vp line associated with its row, a drain, a floating gate and a control gate, the control gate coupled to the p-wordline associated with its row, a p-channel volatile transistor having a source coupled to the drain of the p-channel non-volatile transistor, a drain, and a control gate and a floating gate shorted together and coupled to the program wordline associated with its row, and an n-channel non-volatile transistor having a source coupled to the bit line associated with its column, a drain coupled to the drain of the p-channel volatile transistor, a floating gate and a control gate, the control gate coupled to an n-word line associated with its row, a method for simultaneously programming the n-channel and p-channel non-volatile transistors in a selected memory cell comprising:
   driving to 0 v the p-wordline and the n-wordline for any row in which programming of memory cells is to be inhibited;
   driving to a positive voltage the p-wordline and the n-wordline for any row in which programming of memory cells is to be performed;
   driving to a positive voltage the bit line for any column in which programming of memory cells is to be inhibited;
   driving to a negative voltage the bit line for any column in which programming of memory cells is to be performed;
   driving to one of 0 v and a negative voltage the program wordline for any row in which programming of memory cells is to be inhibited; and
   driving to one of 0 v and a positive voltage the program wordline for any row in which programming of memory cells is to be performed.

2. The method of claim 1 wherein driving to one of 0 v and a negative the program wordline for any row in which programming of memory cells is to be inhibited comprises driving the program wordline for any row in which programming of memory cells is to be inhibited to 0 v.

3. The method of claim 1 wherein driving to one of 0 v and a negative voltage the program wordline for any row in which programming of memory cells is to be inhibited comprises driving the program wordline for any row in which programming of memory cells is to be inhibited to a negative voltage.

4. The method of claim 1 wherein driving to one of 0 v and a positive voltage the program wordline for any row in which programming of memory cells is to be performed comprises driving the program wordline for any row in which programming of memory cells is to be performed to 0 v.

5. The method of claim 1 wherein driving to one of 0 v and a positive voltage the program wordline for any row in which programming of memory cells is to be performed comprises driving the program wordline for any row in which programming of memory cells is to be performed to a positive voltage.

6. The method of claim 1 wherein each p-channel non-volatile transistor and each p-channel non-volatile transistor are formed in a deep n-well, the method further including biasing the deep n-well at a positive voltage.

7. The method of claim 1 wherein each n-channel non-volatile transistor is formed in a high-voltage p-well disposed in the deep n-well, the method further including biasing the deep n-well at a negative voltage.

8. The method of claim 1 wherein driving to a positive voltage the program wordline for any row in which programming of memory cells is to be performed comprises driving the program wordline to a first positive voltage and further including driving the n-wordline to a second positive voltage less than the first positive voltage.

9. In an array of push-pull memory cells arranged in a plurality of rows and columns and comprising a p-word line associated with each row of the array, an n-word line associated with each row of the array, a program-word line associated with each row of the array, a p-bit line associated with each column of the array, an n-bit line associated with each column of the array, a plurality of memory cells, each memory cell uniquely associated with a row in the array and a column in the array, each memory cell including a p-channel non-volatile transistor having a source coupled to the p-bit line associated with its column, a drain, a floating gate and a control gate, the control gate coupled to the p-word line associated with its row, a p-channel volatile transistor having a source coupled to the drain of the p-channel non-volatile transistor, a drain, and a control gate and a floating gate shorted together and coupled to the program-word line associated with its row, and an n-channel non-volatile transistor having a source coupled to the n-bit line associated with its column, a drain coupled to the drain of the p-channel volatile transistor, a floating gate and a control gate, the control gate coupled to the n-word line associated with its row, a method for simultaneously programming the n-channel and p-channel non-volatile transistors in a selected memory cell comprising:

driving to 0 v the p-word line and the n-word line for any row in which programming of memory cells is to be inhibited;

driving to a negative voltage the program wordline for any row in which programming of memory cells is to be inhibited;

driving to a positive voltage the p-word line and the n-word line in any row in which programming of memory cells is to be performed;

driving to 0 v the p-bitline for any column in which programming of memory cells is to be inhibited;

driving to a positive voltage the n-bitline for any column in which programming of memory cells is to be inhibited;

driving to 0 v the p-bitline for any column in which programming of memory cells is to be performed;

driving to a negative voltage the n-bitline for any column in which programming of memory cells is to be performed;

driving to a first negative voltage program wordline for any row in which programming of memory cells is to be inhibited; and driving to a second negative voltage more negative than the first negative voltage program wordline for any row in which programming of memory cells is to be performed.

10. The method of claim 9 wherein each p-channel non-volatile transistor and each p-channel non-volatile transistor are formed in a deep n-well, the method further including biasing the deep n-well at a positive voltage.

11. The method of claim 9 wherein each n-channel non-volatile transistor is formed in a high-voltage p-well disposed in the deep n-well, the method further including biasing the deep n-well at a negative voltage.

12. The method of claim 9 wherein driving to a positive voltage the p-word line and the n-word line for any row in which programming of memory cells is to be performed comprises driving the p-wordline to a first positive voltage and further including driving the n-wordline to a second positive voltage less than the first positive voltage.

* * * * *